United States Patent

Nakayama et al.

[11] Patent Number: 5,917,241
[45] Date of Patent: Jun. 29, 1999

[54] HIGH FREQUENCY SEMICONDUCTOR DEVICE HAVING SOURCE, DRAIN, AND GATE LEADS

[75] Inventors: Osamu Nakayama; Jun Ohtsuji, both of Tokyo; Yukio Nakamura, Kawanishi, all of Japan

[73] Assignee: Mitsubishi Denki Kabushiki Kaisha, Tokyo, Japan

[21] Appl. No.: 08/738,845

[22] Filed: Oct. 28, 1996

[30] Foreign Application Priority Data

May 23, 1996 [JP] Japan .................................. 8-128196

[51] Int. Cl.⁶ ..................... H01L 23/34; H01L 23/495; H01L 23/48; H01L 25/52
[52] U.S. Cl. ..................... 257/728; 257/676; 257/669; 257/692; 333/247
[58] Field of Search ..................... 257/691, 692, 257/728, 664, 669, 676; 333/247

[56] References Cited

U.S. PATENT DOCUMENTS

| | | | |
|---|---|---|---|
| 4,891,686 | 1/1990 | Krausse, III | 257/728 |
| 5,057,805 | 10/1991 | Kadowaki | 333/247 |
| 5,294,897 | 3/1994 | Notani et al. | 333/33 |
| 5,420,459 | 5/1995 | Kozono | 257/666 |
| 5,495,125 | 2/1996 | Uemura | 257/666 |
| 5,512,781 | 4/1996 | Inoue | 257/676 |
| 5,631,809 | 5/1997 | Takagi et al. | 361/820 |

FOREIGN PATENT DOCUMENTS

| | | | |
|---|---|---|---|
| 60-171753 | 9/1985 | Japan . | |
| 60-183755 | 9/1985 | Japan | 257/728 |
| 62-298146 | 12/1987 | Japan | 257/692 |
| 63-151058 | 6/1988 | Japan | 257/692 |
| 1115145 | 5/1989 | Japan . | |
| 217664 | 1/1990 | Japan . | |
| 3-131059 | 6/1991 | Japan | 257/692 |
| 5259336 | 10/1993 | Japan . | |

*Primary Examiner*—Teresa M. Arroyo
*Attorney, Agent, or Firm*—Leydig, Voit & Mayer

[57] ABSTRACT

A high frequency semiconductor device includes a molded resin package having side surfaces; a source lead for die-bonding, having a thickness, partially disposed within the package, and penetrating through the side surfaces of the package; gate and drain leads having the same thickness as the source lead and disposed adjacent to and spaced from the source lead by a distance shorter than the thickness of the source lead, the gate and drain leads being partially disposed within the package and penetrating through the side surfaces of the package; and a field effect transistor die-bonded to the source lead within the package and electrically connected within the package to the source, gate, and drain leads.

1 Claim, 5 Drawing Sheets

HIGH FREQUENCY SEMICONDUCTOR DEVICE HAVING SOURCE, DRAIN, AND GATE LEADS

FIELD OF THE INVENTION

The present invention relates to high frequency semiconductor devices and, more particularly, to field effect transistors (FETs), high electron mobility transistors (HEMTs), and microwave monolithic integrated circuits (MMICs) which are encapsulated in resin packages.

BACKGROUND OF THE INVENTION

Ceramic hollow packages have been used for high frequency semiconductor devices operating at high frequencies exceeding 200 MHz. In recent years, however, in order to reduce the cost, inexpensive molded resin packages have been examined.

FIGS. 7(a) and 7(b) are diagrams illustrating a GaAs FET device as an example of a conventional high frequency semiconductor device encapsulated in a molded resin package FIG. 7(a) is a perspective view of the device, and FIG. 7(b) is a cross-sectional view taken along line 7b—7b in FIG. 7(a). In these figures, reference numeral 5 designates leads comprising 0.125~0.15 mm thick Fe—Ni alloy.

These leads are a source lead 5a, a gate lead 5b, and a drain lead 5c. The space d between the source lead 5a and the gate-lead 5b or the drain lead 5c is wider than the thickness of these leads A square GaAs FET chip 1, about 0.15 mm thick and about 0.4 mm long along each side, is die-bonded onto the source lead 5a with a bonding material 3, such as solder. Terminals (not shown) of the FET chip 1 are connected to the leads 5 with Au wires 2. The FET chip 1 is encapsulated in a molded resin package 7. The package 7 is about 1 mm thick and about 2 mm long along each side. The FET chip 1 is located in the middle of the height of the package 7. In order to facilitate soldering of the package 7 to a printed substrate (not shown) in a subsequent mounting process, the leads 5 are downwardly bent with respect to the planar front surface of the package 7, and end portions of the respective leads 5 are outwardly bent so that the end portions are parallel to and level with the planar bottom of the package 7. That is, each lead 5 is bent stepwise from the side surface of the package 7 toward the end of the lead. Reference character δ designates a height of a bent portion of each lead 5, more specifically, a distance from an upper surface of a lowermost portion of the lead 5 and an upper surface of an uppermost portion of the lead 5. The height δ is about 0.4 mm.

A description is given of a method of fabricating the GaAs FET device shown in FIGS. 7(a) and 7(b).

Initially, a metal plate, such as an Fe—Ni alloy plate, is prepared, and desired openings are formed in the metal plate by chemical etching or punching to produce a lead frame (not shown) in which planar leads 5a, 5b, 5c are connected with each other through a metal frame. An FET chip 1 is die-bonded onto the source lead 5a in the lead frame, and terminals of the chip 1 are connected to the leads 5a, 5b, and 5c with Au wires 2. Thereafter, a portion of the lead frame where the chip 1 is die-bonded is sealed in a molded resin, such as epoxy resin. For example, this sealing is performed by sandwiching the lead frame with a pair of metal molds and pouring a liquid resin into the metal molds. Thereby, a molded resin package 7 is produced. Finally, the metal frame is cut from the lead frame to separate the leads 5a, 5b, and 5c from each other, and the leads outside the package 7 are bent as shown in FIG. 7(a).

The conventional molded resin package has an advantage over a ceramic package in being more cheaply produced.

However, a high frequency semiconductor device, such as a GaAs FET, sealed in a molded resin package is inferior to a high frequency semiconductor device sealed in a ceramic package in the gain characteristic which is very important for a high frequency semiconductor device. For example, the gain is reduced by 2~3 dB.

FIELD OF THE INVENTION

An object of the present invention to provide a high frequency semiconductor device employing a molded resin package which is produced inexpensively and provides improved high frequency characteristics.

Other objects and advantages of the invention will become apparent from the detailed description that follows. The detailed description and specific embodiments described are provided only for illustration since various additions and modifications within the scope of the invention will be apparent to those of skill in the art from the detailed description According to a first aspect of the present invention, a high frequency semiconductor device comprises a molded resin package having side surfaces, a planar bottom, and a center region; a plurality of leads partially included in the package and partially penetrating through the side surfaces of the package, portions of the leads within the center region of the package protruding upward, and portions of the leads outside the package being planar and extending outward in the direction parallel to the bottom of the package; and a high frequency semiconductor element die-bonded to a protruding portion of one of the leads within the package and electrically connected to the respective leads within the package Therefore, the height of a bent portion of each lead can be reduced while maintaining a sufficient strength of the package, resulting in a high frequency semiconductor device using an inexpensive resin package and providing improved high frequency characteristics According to a second aspect of the present invention, in the above-mentioned high frequency semiconductor device, the leads penetrate through portions of the package where the side surfaces and the bottom meet. So, the leads are partially exposed at the bottom of the package Therefore, the distance between the semiconductor element included in the package and the leads outside the package is reduced, whereby the high frequency inductance is reduced.

According to a third aspect of the present invention, a molded resin package having side surfaces, a planar bottom, and a center region; a first lead for die-bonding, having a thickness, partially included in the package and partially penetrating through the side surfaces of the package; a plurality of second leads having the same thickness as the first lead and disposed adjacent to the first lead at a distance shorter than the thickness of the first lead, the second leads partially included in the package and partially penetrating through the side surfaces of the package; and a high frequency semiconductor element die-bonded to the first lead within the package and electrically connected to the first lead and the second leads within the package. Since the space between the first lead for die-bonding and the second leads is narrower than the thickness of the first and second leads, the gain is improved, resulting in a high frequency semiconductor device using an inexpensive resin package and providing improved high frequency characteristics.

DETAILED DESCRIPTION OF THE PREFERRED EMBODIMENTS

[Embodiment 1]

Figure 4:
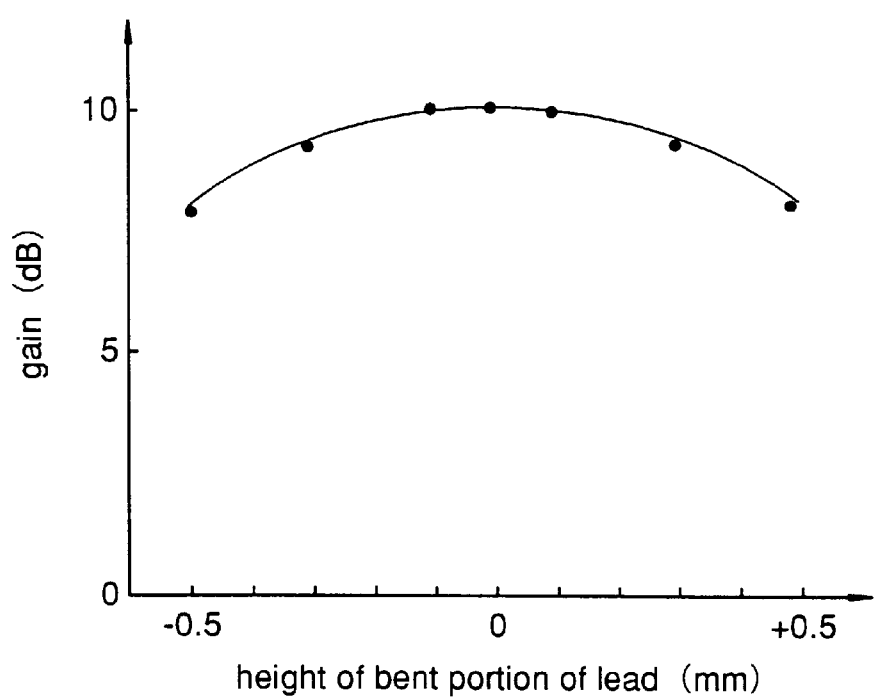
FIG. 4 is a graph for explaining the gain characteristics of the high frequency semiconductor device according to the first embodiment of the invention.
Figure 7:
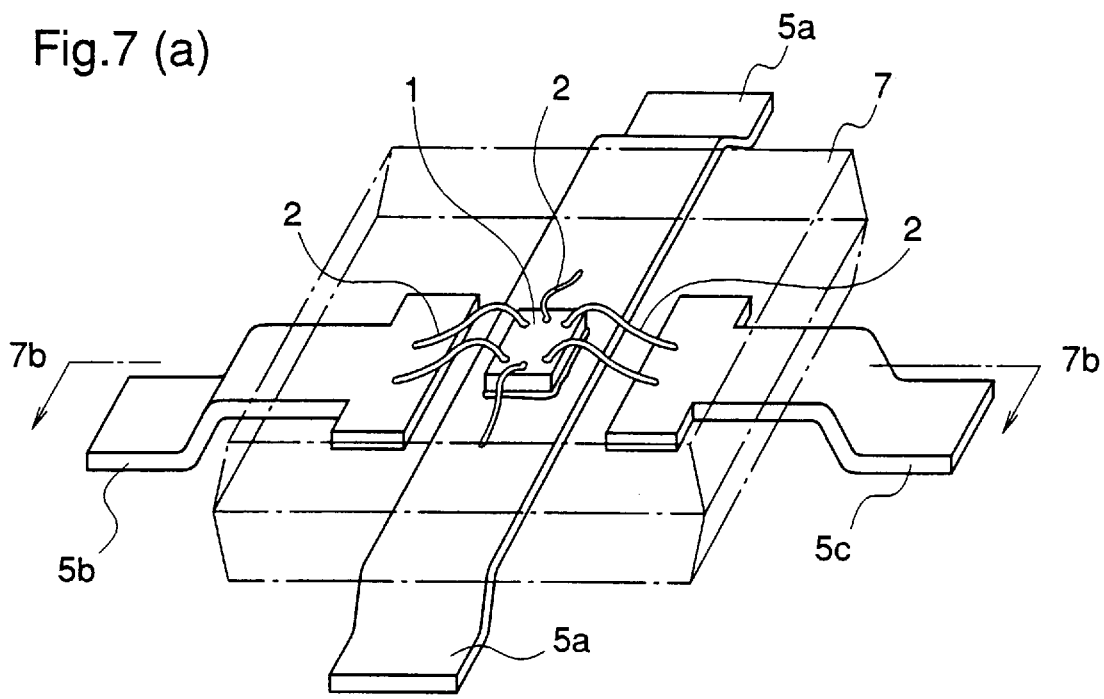
FIGS. 7(a) and 7(b) are a perspective view and a cross-sectional view, respectively, illustrating a structure of a high frequency semiconductor device according to the prior art.
Figure 7:
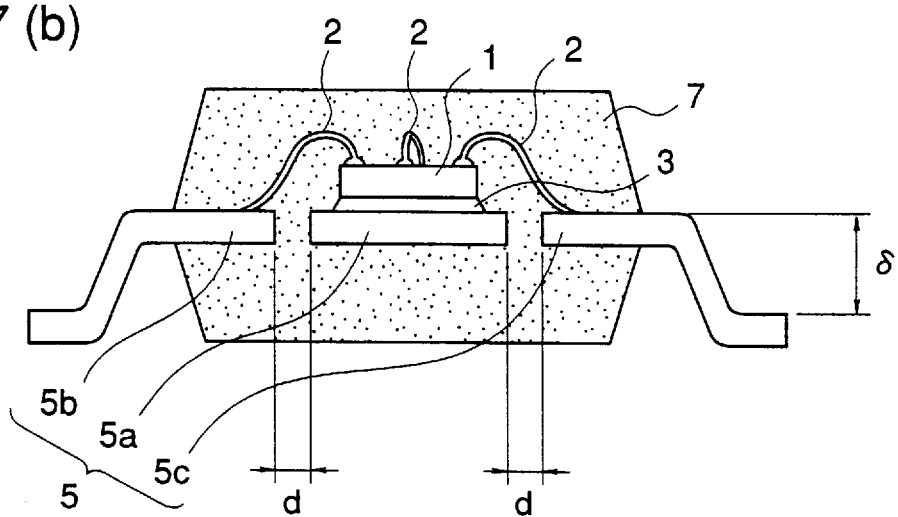

The inventors of the present invention examined the relationship between the height δ of a bent portion of each lead and gain when all leads are bent in a conventional high frequency semiconductor device using a molded resin package as shown in FIGS. 7(a) and 7(b). The result is shown in FIG. 4. In FIG. 4, the ordinate shows the gain (dB) and the abscissa shows the height δ of a bent portion of a lead (mm). In this experiment, a GaAs FET device similar to that shown in FIGS. 7(a) and 7(b) was employed.

As can be seen from FIG. 4, when δ is zero, i.e., when no leads are bent, the highest gain is obtained. That is, the gain is reduced as the leads are bent Therefore, in order to improve the high frequency characteristics, the height δ of a bent portion of each lead must be reduced, preferably to less than 0.2 mm.

However, in the conventional high frequency semiconductor device shown in FIGS. 7(a) and 7(b), since the leads 5 are located in almost the middle of the resin package 7, when the leads 5 are not bent or the height δ of a bent portion of each lead is less than 0.2 mm, the difference in levels between the bottom of the package 7 and the leads 5 penetrating through the package 7 and extending outward is so considerable that these leads 5 cannot be bonded to a printed substrate with solder.

Further, in order to enable solder-bonding of the leads 5, it is thought that the difference in levels between the bottom of the package 7 and the leads 5 within the package 7 should be reduced to less than 0.2 mm and the leads 5 outside the package 7 can be bent In this case, however, the thickness of the resin between the leads 5 within the package 7 and the bottom of the package 7 is thinner than 0.2 mm, so that the strength for supporting the leads 5 is reduced Therefore, when the leads 5 outside the package 7 are bent, a stress is applied to the package 7 and a portion of the package 7 where the leads 5 are disposed cracks and exfoliates, whereby the leads 5 are exposed at the bottom of the package 7 or separated from the package 7.

Alternatively, it is thought that the distance between the leads 5 within the package 7 and the bottom of the package 7 is made very short, for example, less than 0.1 mm, and the leads 5 outside the package 7 are not bent when bonded to a printed substrate. Also in this case, since the thickness of the resin between the leads 5 and the bottom of the package 7 is very thin, the strength for supporting the leads 5 is reduced Therefore, while the semiconductor device is handled, the bottom of the package 7 cracks and exfoliates, whereby the leads 5 are exposed at the bottom of the package 7 or separated from the package 7.

Because of the problems mentioned above, it is very difficult to improve the high frequency characteristics of the conventional high frequency semiconductor device sealed in a molded resin package by reducing the height δ of the leads.

However, those problems are solved in a high frequency semiconductor device sealed in a molded resin package according to the present invention, and the high frequency characteristics are improved by reducing the height δ of the leads.

Figure 1:
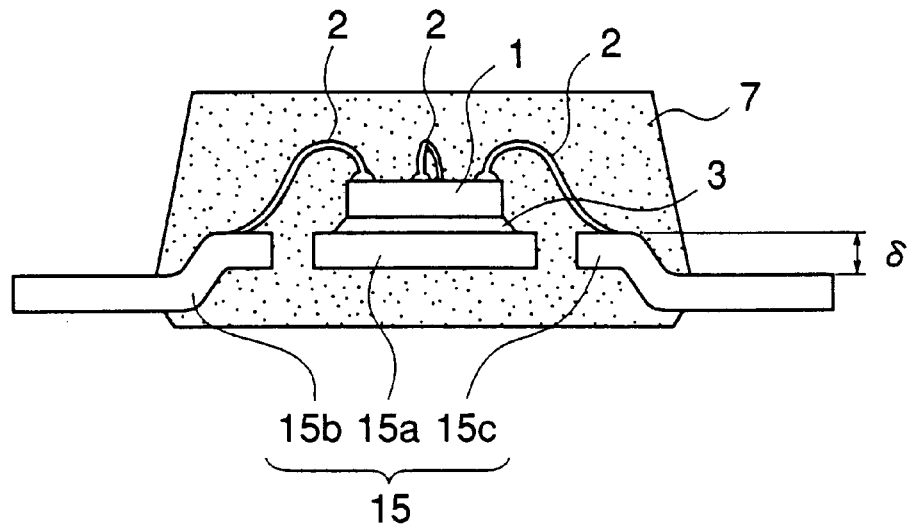
FIG. 1 is a cross-sectional view illustrating a structure of a high frequency semiconductor device in accordance with a first embodiment of the present invention.

FIG. 1 is a cross-sectional view illustrating a structure of a high frequency semiconductor device according to a first embodiment of the present invention, taken along a line perpendicular to a source lead. In the figure, reference numeral 15 designates leads comprising 0.125~0.15 mm thick Fe—Ni alloy. These leads 15 are a source lead 15a, a gate lead 15b, and a drain lead 15c. A square GaAs FET chip 1, about 0.15 mm thick and about 0.4 mm long along each side, is die-bonded onto the source lead 15a with a bonding material 3, such as solder Terminals (not shown) of the FET chip 1 are connected to the leads 15 with Au wires 2. The FET chip 1 is encapsulated in a molded resin package 7. The package 7 is about 1 mm thick and about 2 mm long along each side. In this first embodiment of the invention, portions of the leads 15 in the center of the package 7 protrude upward, and portions of the leads 15 outside the package 7 are planar and parallel to the bottom of the package 7. The height of the external portions of the leads 15 from the bottom of the package 7 is adjusted to about 0.1 mm or less, which height enables solder-bonding of the leads when the semiconductor device is mounted on a printed substrate Further, the height δ of a bent portion of each lead 15, that is, the difference in heights from the bottom of the package 7 between an upper surface of a lowermost portion of the lead 15 and an upper surface of an uppermost portion of the lead 15, is 0.1~0.2 mm, and the height of the upper surface of the uppermost portion of the lead 15 from the bottom of the package 7 is 0.2~0.3 mm.

FIGS. 6(a)–6(e) are perspective views illustrating process steps in a method of producing a high frequency semiconductor device according to the first embodiment of the present invention. In these figures, the same reference numerals as those shown in FIG. 1 designate the same or corresponding parts. Reference numeral 10 designates a lead frame, and reference numeral 10a designates a center region of the lead frame 10.

Figure 6:
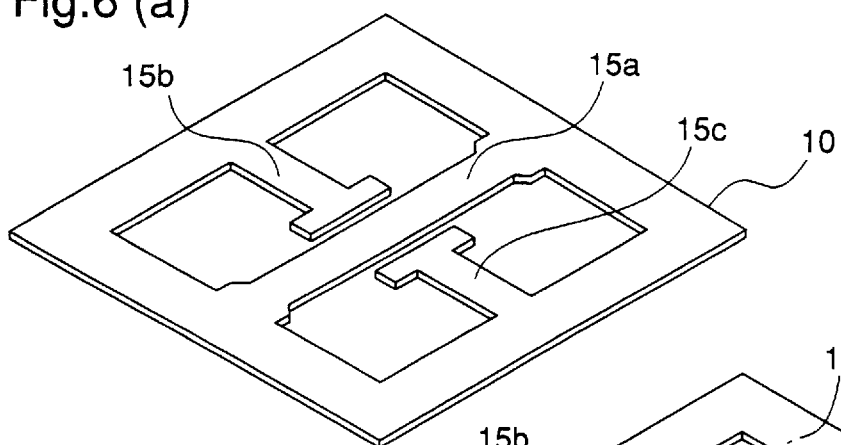
FIGS. 6(a)–6(e) are perspective views illustrating process steps in a method of producing the high frequency semiconductor device according to the first embodiment of the invention.
Figure 6:
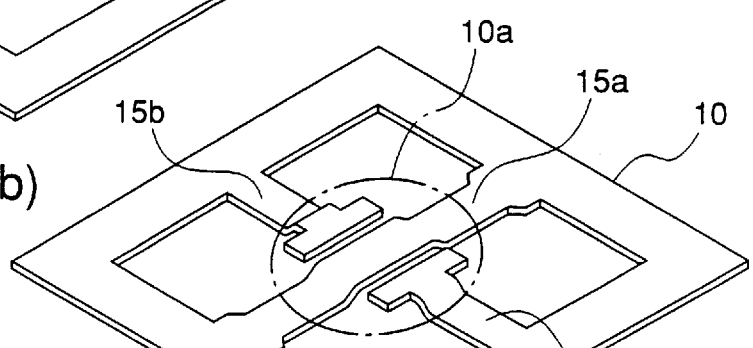
Figure 6:
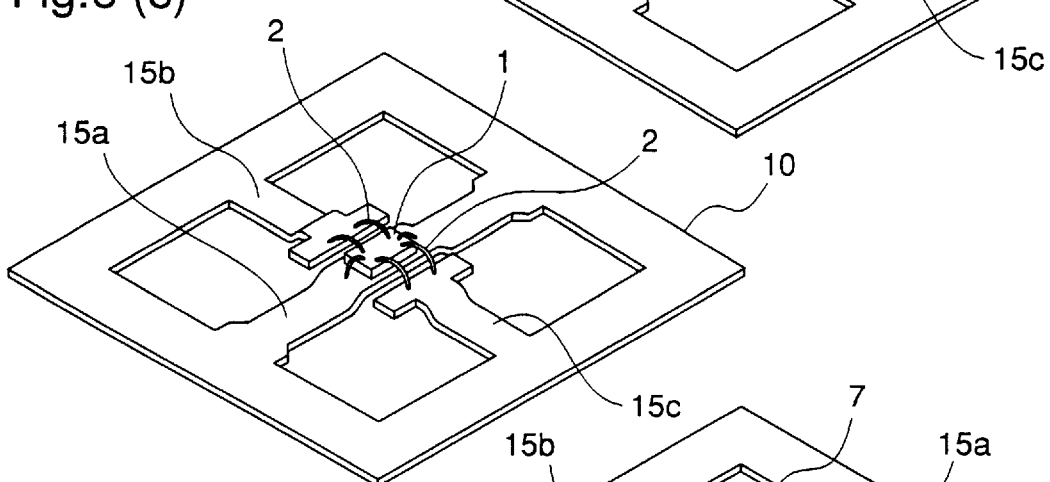
Figure 6:
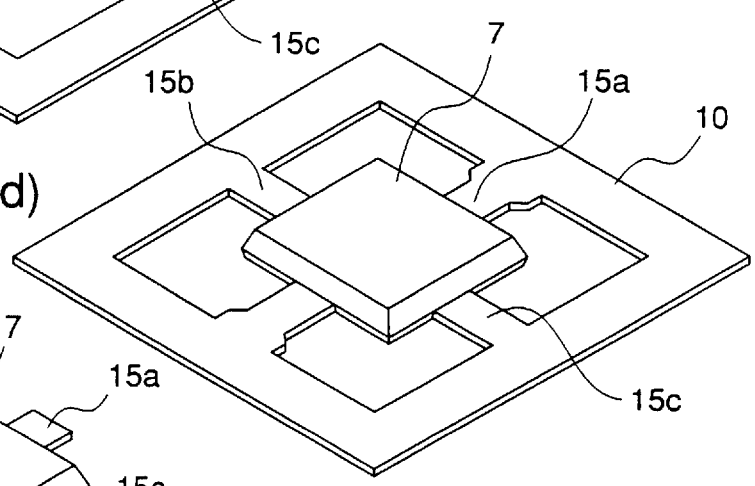
Figure 6:
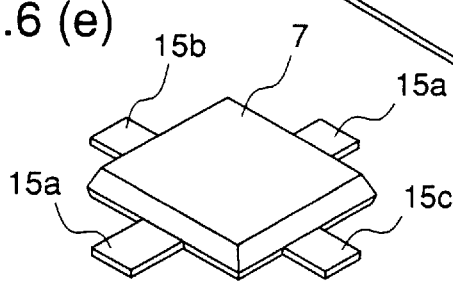

Initially, a metal plate, such as an Fe—Ni alloy plate, is prepared, and desired openings are formed in the metal plate by chemical etching or punching to produce a planar lead frame 10 wherein a source lead 15a, a gate lead 15b, and a drain lead 15c are connected with each other through a metal frame (FIG. 6(a)). Thereafter, the leads 15a, 15b, and 15c are bent, i.e., protruded, upwardly in a center region 10a of the lead frame 10 where an FET chip 1 is later die-bonded so that each lead has a height of 0.1~0.2 mm in this region 10a (FIG. 6(b)).

Next, an FET chip 1 is die-bonded onto a protruding portion of the source lead 15a within the center region 10a, and terminals (not shown) of the FET chip 1 are electrically connected to the respective leads 15 with Au wires 2 (FIG. 6(c)).

Thereafter, a region of the lead frame 10 including the center region 10a is sealed with a molded resin, such as epoxy resin, thereby producing a molded resin package 7

(FIG. 6(d)). For example, this sealing is performed by sandwiching the lead frame with metal molds and pouring a liquid resin into the metal molds.

Finally, the metal frame is cut from the lead frame to separate the leads 15a, 15b, and 15c from each other, resulting in a high frequency semiconductor device as shown in FIG. 6(e).

In this first embodiment of the invention, since the leads 15 protrude upward in the center of the package 7, the thickness of the resin is larger beneath the protruding portions of the leads 15 than beneath other portions of the leads 15. So, even when the leads 15 outside the package 7 are planar and parallel to the bottom of the package 7 and the height of the leads 15 outside the package 7 from the bottom of the package 7 is less than 0.1 mm, which enables solder-bonding of the leads 15 to a printed substrate, the thickness of the resin beneath the protruding portions of the leads 15 within the package 7 is sufficient to provide a sufficient strength of the package 7. Therefore, the bottom of the package 7 is hardly cracked by stress applied to the package 7 when the semiconductor device is handled. Furthermore, although a large stress is applied to the package when the leads outside the package are bent as shown in FIGS. 7(a) and 7(b), since it is not necessary to bend the leads 15 outside the package 7 in this first embodiment of the invention, unwanted cracking of the package 7 and separation of the leads 15 from the package 7 are avoided.

Furthermore, since the leads 15 are bent within the package 7, the resistance of the leads 15 to a force in the direction toward the outside of the package 7 is increased, so that unwanted separation of the leads 15 from the package 7 is avoided. In addition, moisture hardly invades the package through the boundaries between the leads 15 and the resin, so that the durability and quality of the semiconductor device are improved.

According to the first embodiment of the present invention, portions of the leads 15 in the center of the package 7 are bent upwardly while potions of the leads 15 outside the package 7 are planar and parallel to the bottom of the package 7. Therefore, it is possible to reduce the height δ of a bent portion of each lead 15 while maintaining a sufficient strength of the lead 15, resulting in a high frequency semiconductor device using an inexpensive molded resin package and providing improved high frequency characteristics.

[Embodiment 2]

Figure 2:
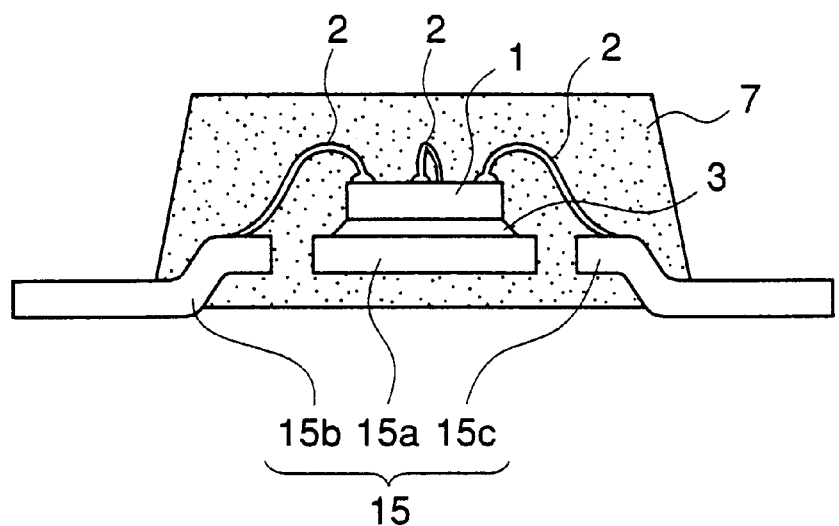
FIG. 2 is a cross-sectional view illustrating a structure of a high frequency semiconductor device in accordance with a second embodiment of the present invention.

FIG. 2 is a cross-sectional view illustrating a high frequency semiconductor device according to a second embodiment of the present invention, taken along a line perpendicular to a source lead. In FIG. 2, the same reference numerals as those shown in FIG. 1 designate the same or corresponding parts.

In the first embodiment of the invention, each lead 15 is bent, i.e., protruded, upwardly in the center of the package 7 and extends out of the package 7 through a portion on the side surface of the package 7 at a prescribed height from the bottom of the package 7. However, in this second embodiment of the invention, each lead 15 is bent upwardly in the center of the package 7 as in the first embodiment but extends out of the package 7 through a portion of the package 7 where the side surface and the bottom meet. So, the lead 15 is partially exposed at the bottom of the package 7.

Also in this case, as in the first embodiment of the invention, the height δ of a bent portion of each lead 15 can be reduced while maintaining a sufficient strength of the package, resulting in a high frequency semiconductor device using an inexpensive molded resin package and providing improved high frequency characteristics Furthermore, since the semiconductor device can be mounted on a printed substrate by soldering the portions of the leads 15 exposed at the bottom of the package 7, the distance between the chip 1 within the package 7 and the soldered portions of the leads 15 is reduced, whereby the high frequency inductance is reduced.

[Embodiment 3]

Figure 3:
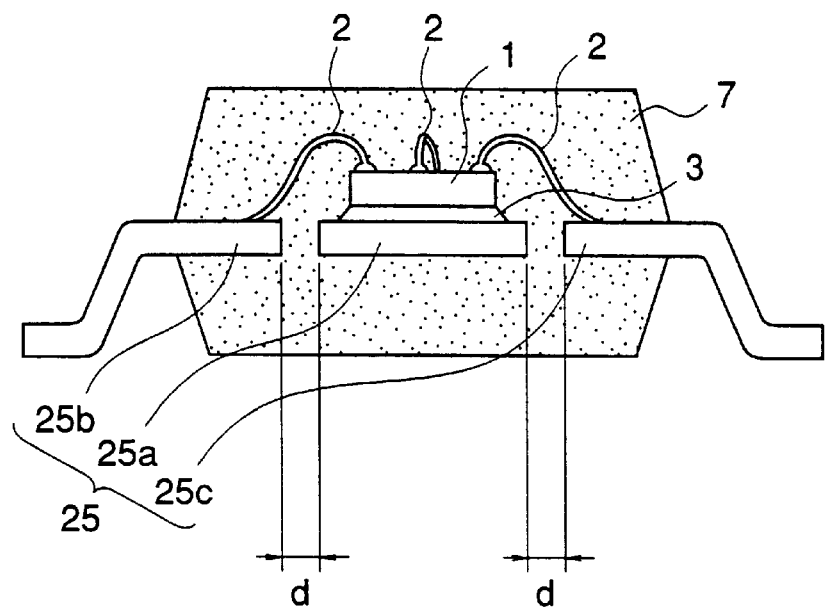
FIG. 3 is a cross-sectional view illustrating a structure of a high frequency semiconductor device in accordance with a third embodiment of the present invention.

FIG. 3 is a cross-sectional view illustrating a high frequency semiconductor device in accordance with a third embodiment of the present invention, taken along a line perpendicular to a source lead. In the figure, the same reference numerals as those shown in FIG. 1 designate the same or corresponding parts. Reference numeral 25 designates leads comprising 0.125~0.15 mm thick Fe—Ni alloy. These leads 25 are a source lead 25a, a gate lead 25b, and a drain lead 25c. The space d between the source lead 25a and the gate lead 25b or the drain lead 25c is narrower than the thickness of these leads, preferably, 0.08~0.12 mm.

When a lead frame is formed from a metal plate, openings between the leads 25a, 25b, and 25c are formed by etching both sides of the metal plate simultaneously, and the space d is controlled by controlling etching time or the like. However, punching may be employed as long as the precision can be controlled.

A lead frame for a conventional high frequency semiconductor device as shown in FIGS. 7(a) and 7(b) is usually formed by chemical etching or punching, and the space d between the source lead 5a and the gate lead 5b (drain lead 5c) is made wider than the thickness of the leads to facilitate control of the precision in the fabrication process.

Figure 5:
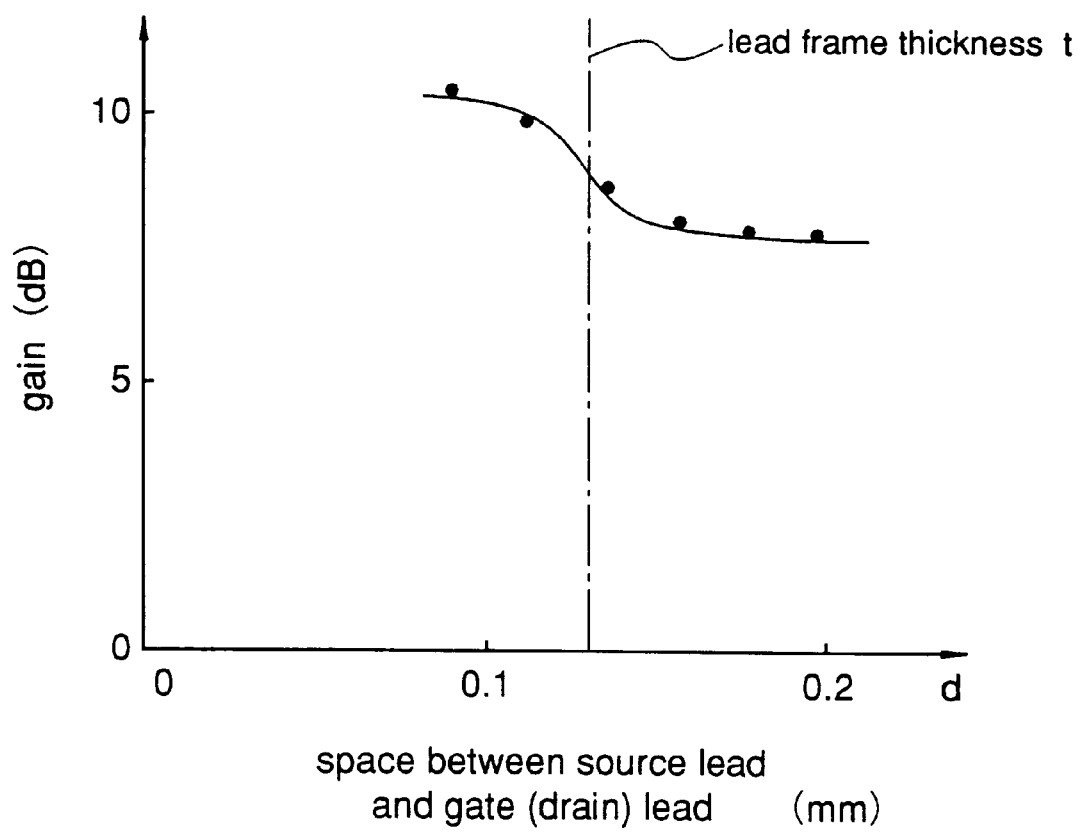
FIG. 5 is a graph for explaining the gain characteristics of the high frequency semiconductor device according to the third embodiment of the invention.

However, the inventors of the present invention found by their earnest researches that, in case of a high frequency semiconductor device, such as a GaAs FET, the gain of the device significantly varies when the space d between the source lead to which a high frequency semiconductor chip is die-bonded varies relative to the thickness t of the lead frame. More specifically, the gain is high when the space d is smaller than the thickness t, but suddenly decreases when the space d exceeds the thickness t. FIG. 5 shows the relationship between the gain and the space between the source lead and the gate (drain) lead when the thickness of the lead frame is fixed. In FIG. 5, the ordinate shows the gain (dB), and the abscissa shows the space between the source lead and the gate (drain) lead (mm). The thickness of the lead frame is 0.125 mm.

Accordingly, in the high frequency semiconductor device according to this third embodiment of the invention, the space d between the source lead 25a and the gate lead 25b (drain lead 25c) is narrower than the thickness of these leads, specifically, 0.08~0.12 mm, whereby the gain is improved without increasing the material cost, resulting in a high frequency semiconductor device using an inexpensive molded resin package and providing improved high frequency characteristics.

In the foregoing description, emphasis has been placed upon a high frequency semiconductor device including a source lead, a gate lead, and a drain lead. However, the number of the leads may be changed according to the structure of a semiconductor element sealed in the package.

Further, although emphasis has been placed upon a GaAs FET device in the foregoing description, the present invention may be applied to other high frequency semiconductor devices, for example, HEMTs, MMICs, or high frequency semiconductor devices including Si elements.

What is claimed is:

1. A high frequency semiconductor device comprising:

a molded resin package having side surfaces;

a source lead for die-bonding, having a thickness, partially disposed within the package, and penetrating through the side surfaces of the package;

gate and drain leads having the same thickness as the source lead and disposed adjacent to and spaced from the source lead by a distance shorter than the thickness of the source lead, the gate and drain leads being partially disposed within the package and penetrating through the side surfaces of the package; and a field effect transistor die-bonded to the source lead within the package and electrically connected within the package to the source, gate, and drain leads.

* * * * *